(12) United States Patent
Fotouhi et al.

(10) Patent No.: US 6,906,593 B2
(45) Date of Patent: Jun. 14, 2005

(54) FREQUENCY COMPENSATION OF WIDE-BAND RESISTIVE GAIN AMPLIFIER

(75) Inventors: Bahram Fotouhi, Cupertino, CA (US); Roubik Gregorian, Saratoga, CA (US)

(73) Assignee: Exar Corporation, Fremont, CA (US)

( * ) Notice: Subject to any disclaimer, the term of this patent is extended or adjusted under 35 U.S.C. 154(b) by 0 days.

(21) Appl. No.: 10/681,862

(22) Filed: Oct. 7, 2003

(65) Prior Publication Data

US 2005/0073364 A1 Apr. 7, 2005

(51) Int. Cl.$^7$ ................................................. H03F 1/14
(52) U.S. Cl. ........................ 330/292; 330/260; 330/306
(58) Field of Search ............................... 330/292, 260, 330/306

(56) References Cited

U.S. PATENT DOCUMENTS

| | | | |
|---|---|---|---|
| 3,679,987 A | * 7/1972 | Moschytz | 330/107 |
| 4,200,863 A | * 4/1980 | Hodges et al. | 341/156 |
| 5,744,385 A | 4/1998 | Hojabri | |
| 5,880,634 A | * 3/1999 | Babanezhad | 330/126 |
| 6,005,280 A | 12/1999 | Dierschke et al. | |
| 2003/0094954 A1 | 5/2003 | Mashiko | |

FOREIGN PATENT DOCUMENTS

JP 2003218222 7/2003

* cited by examiner

*Primary Examiner*—Patricia Nguyen
(74) *Attorney, Agent, or Firm*—Townsend and Townsend and Crew LLP

(57) ABSTRACT

A technique for minimizing the effect of parasitic capacitance in a resistive gain amplifier. Instead of the resistors being formed directly over the substrate, or over an oxide of the substrate, a semiconductor element (e.g., an n-well) is used between the resistor and the substrate. For resistors in the input circuit, this semiconductor element is connected to the voltage input rather than ground. For the resistors in the feedback loop circuit, the semiconductor element is connected to the voltage output of the operational amplifier. The insertion of this semiconductor element provides the ability to programmably connect the parasitic capacitance to somewhere other than ground. By connecting the parasitic capacitance to the voltage input or voltage output, the ground connection is eliminated, eliminating the pole introduced by the parasitic capacitance.

13 Claims, 3 Drawing Sheets

FREQUENCY COMPENSATION OF WIDE-BAND RESISTIVE GAIN AMPLIFIER

CROSS-REFERENCES TO RELATED APPLICATIONS

Not Applicable

STATEMENT AS TO RIGHTS TO INVENTIONS MADE UNDER FEDERALLY SPONSORED RESEARCH OR DEVELOPMENT

Not Applicable

REFERENCE TO A "SEQUENCE LISTING," A TABLE, OR A COMPUTER PROGRAM LISTING APPENDIX SUBMITTED ON A COMPACT DISK

Not Applicable

BACKGROUND OF THE INVENTION

The present invention relates to techniques for compensating for parasitic capacitance associated with the gain resistors of an operational amplifier circuit, and in particular compensating for the extra phase shift introduced by the parasitic poles due to this parasitic capacitance.

FIG. 1 illustrates a resistive gain amplifier circuit having an operational amplifier 10 with resistors R1, R2, R3 and R4 connected between a voltage input 12 and a voltage output 14. A switch 16 determines a connection to the inverting input of operational amplifier 10 between a point A (between R4 and R3), a point B (between R3 and R2), and a point C (between R2 and R1). Depending upon which position is selected, the gain of the amplifier is varied accordingly. Each of the resistors, when constructed on a semiconductor chip, will have associated parasitic capacitance between the resistor and the substrate. These parasitic capacitances are modeled in the circuit of FIG. 1 as capacitors between the resistor and ground (since the substrate is grounded). Thus, resistor R4 has parasitic capacitance C42 and C41. Resistor R3 has parasitic capacitance C32 and C31. Resistor R2 has parasitic capacitance C22 and C21. Resistor R1 has parasitic capacitance C12 and C11. Also shown in FIG. 1 are the load resistance and capacitance, RL and CL, connected to ground.

A problem with the circuit of FIG. 1 is that for high-frequency gain, the parasitic capacitances cause a degradation of the phase margin to the point of instability, rendering such high gain stages difficult to frequency compensate.

Depending on the type of resistor material, i.e., diffusion or polysilicon, the capacitors are either junction capacitors or polysilicon-to-substrate capacitances. These capacitances, together with the resistors, introduce additional phase shift in the feedback loop, degrading the phase margin and frequency stability of the operational amplifier. The effect on the phase margin becomes more severe for larger resistors or wider band amplifiers as the extra poles due to these resistor/capacitor (RC) circuits are pulled into the bandwidth of the amplifier.

One approach to dealing with a parasitic capacitance or resistor is shown in U.S. Pat. No. 6,472,942. This patent adds a parallel capacitance in order to compensate for the parasitic substrate capacitance. In other words, this patent attempts to create a zero to compensate for the pole induced by the parasitic capacitance. A similar approach is shown in U.S. Pat. No. 6,005,280. Here, a resistor is shown extending over two different n-wells. One of the n-wells is connected to ground, and the other is connected to the output. Again, this attempts to put a zero on top of a pole in order to compensate for the parasitic capacitance.

U.S. Pat. No. 5,880,634 also shows a method for compensating for the parasitic capacitance by canceling out the parasitic capacitance. This is done by including a compensation capacitor $C_c$ adding a value equal to ⅙ of the parasitic capacitance.

BRIEF SUMMARY OF THE INVENTION

The present invention provides a unique and straightforward technique for minimizing the effect of parasitic capacitance in a resistive gain amplifier. Instead of the resistors being formed directly over the substrate, or over an oxide of the substrate, a semiconductor element (e.g., an n-well) is used between the resistor and the substrate. For resistors in the input circuit, this semiconductor element or n-well is connected to the voltage input rather than ground. For the resistors in the feedback loop circuit, the semiconductor element or n-well is connected to the voltage output of the operational amplifier. The insertion of this semiconductor element or n-well provides the ability to programmably connect the parasitic capacitance to somewhere other than ground. By connecting the parasitic capacitance to the voltage input or voltage output, the ground connection is eliminated, eliminating the pole introduced by the parasitic capacitance. Thus, there is no need to delicately match a compensation capacitor or use the other techniques of the prior art.

In one embodiment, a number of resistors are included between the voltage input and the voltage output, and these resistors can be programmably connected to vary the number of resistors in either the input circuit or the feedback circuit. The n-wells in which these resistors are formed can be correspondingly connected, programmably, to either the voltage input or the voltage output depending upon where the resistor itself is connected. Thus, the poles associated with the parasitic capacitances are changed to transmission zeros, significantly improving the phase margin of the operational amplifier circuit.

For a further understanding of the nature and advantages of the invention, reference should be made to the following description taken in conjunction with the accompanying drawings.

DETAILED DESCRIPTION OF THE INVENTION

Figure 1:
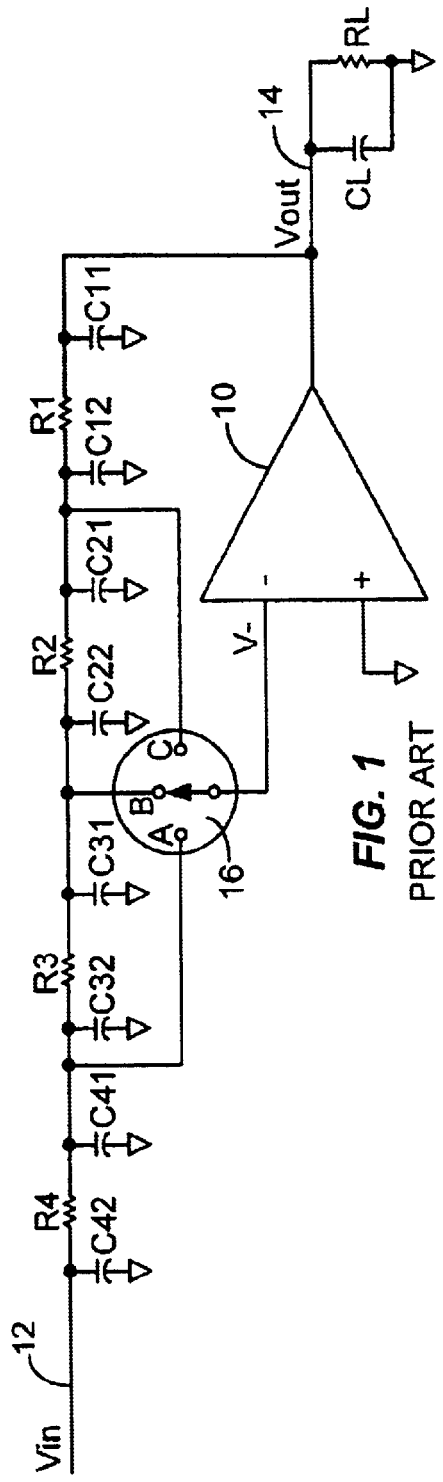
FIG. 1 is a circuit diagram of a prior art operational amplifier with programmable gain.
Figure 2:
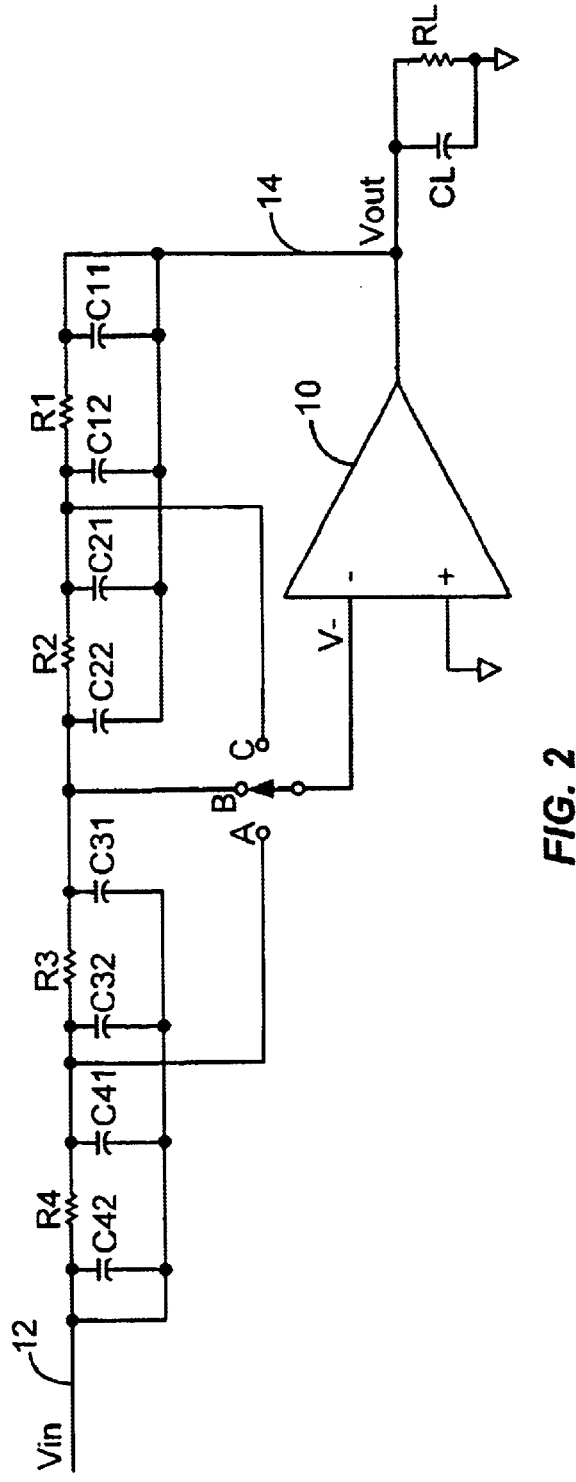
FIG. 2 is a circuit diagram of an embodiment of the present invention applied to the circuit of FIG. 1.

FIG. 2 illustrates the principle of the present invention applied to the circuit of FIG. 1. As can be seen, the parasitic capacitances C31, C32, C41 and C42 are now connected to the voltage input 12 rather than ground as in FIG. 1. Similarly, parasitic capacitances C22, C21, C12 and C11 are connected to the voltage output 14 rather than ground. These connections are for the particular configuration where node B is connected to the inverting input of operational amplifier 10, putting resistors R1 and R2 in the feedback loop and resistors R3 and R4 in the input circuit. The ability to connect the capacitances as shown is provided by using a semiconductor layer to enable a connection between the resistor and substrate. In one embodiment, this is done using an n-well as illustrated in FIG. 3.

Figure 3:
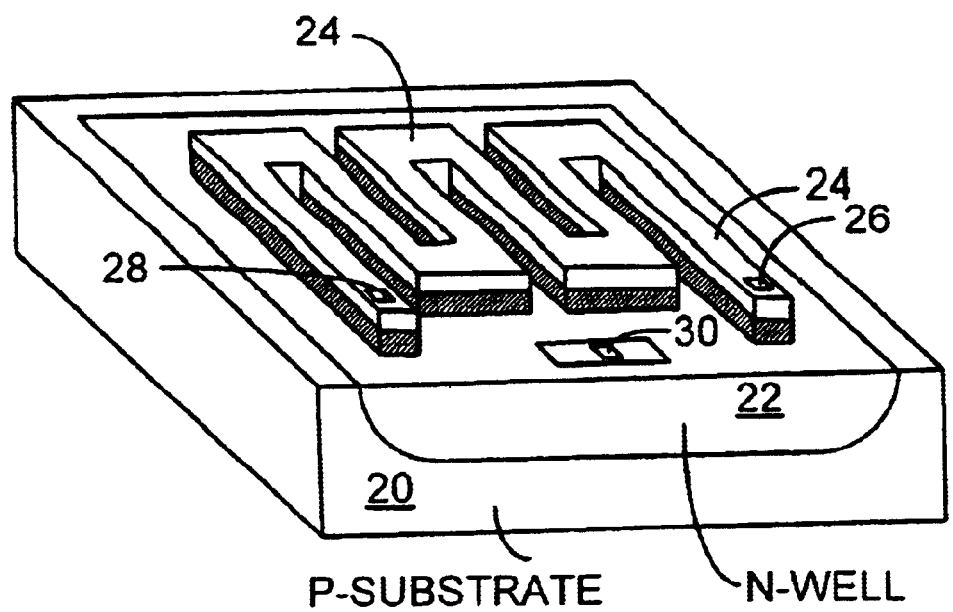
FIG. 3 is cross-sectional view of one embodiment of a resistor in an n-well according to the present invention.

FIG. 3 is a cross-sectional view showing a semiconductor structure with a p-substrate 20 above which is an n-well 22. Placed over the n-well is a polysilicon resistor 24. Although shown as a serpentine arrangement for the resistor, other structures could be used. Resistor 24 has contact regions 26 and 28 for making the connections to the resistor as desired. Also, a connection 30 to the n-well is provided, enabling the n-well to be connected either to the voltage input or voltage output. Typically, the p-substrate 20 is connected to ground. Thus, absent the n-well, the parasitic capacitance would be connected to ground as illustrated in FIG. 1.

Figure 4:
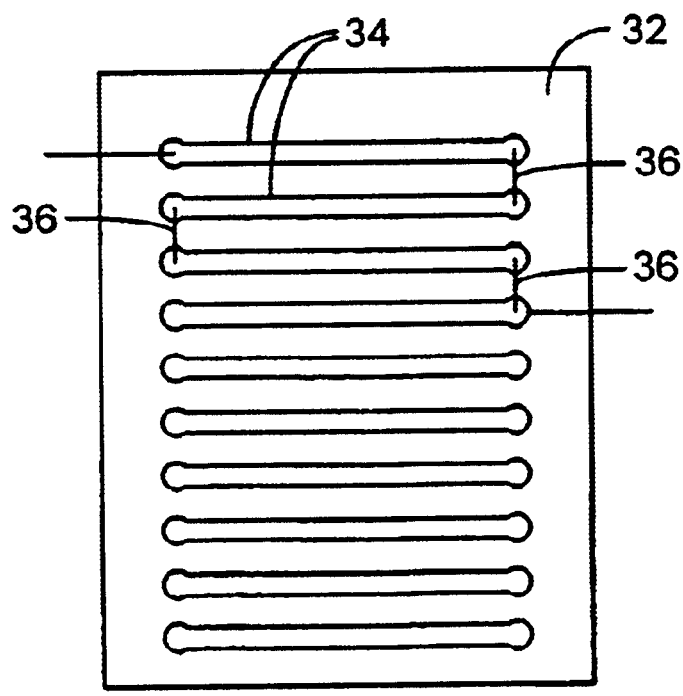
FIG. 4 is a diagram illustrating an n-well with multiple elements for programming a resistor size according to an embodiment of the present invention.

FIG. 4 illustrates one alternate resistor structure in which an n-well region 32 includes a number of polysilicon regions 34 that can be interconnected by metal layers 36 as shown to provide programmable sizes for the resistor. As illustrated, a group of four polysilicon strips are connected together to provide the resistors, but other sizes could be used as well. For example, all regions could be connected together, only one could be used, etc.

Figure 5:
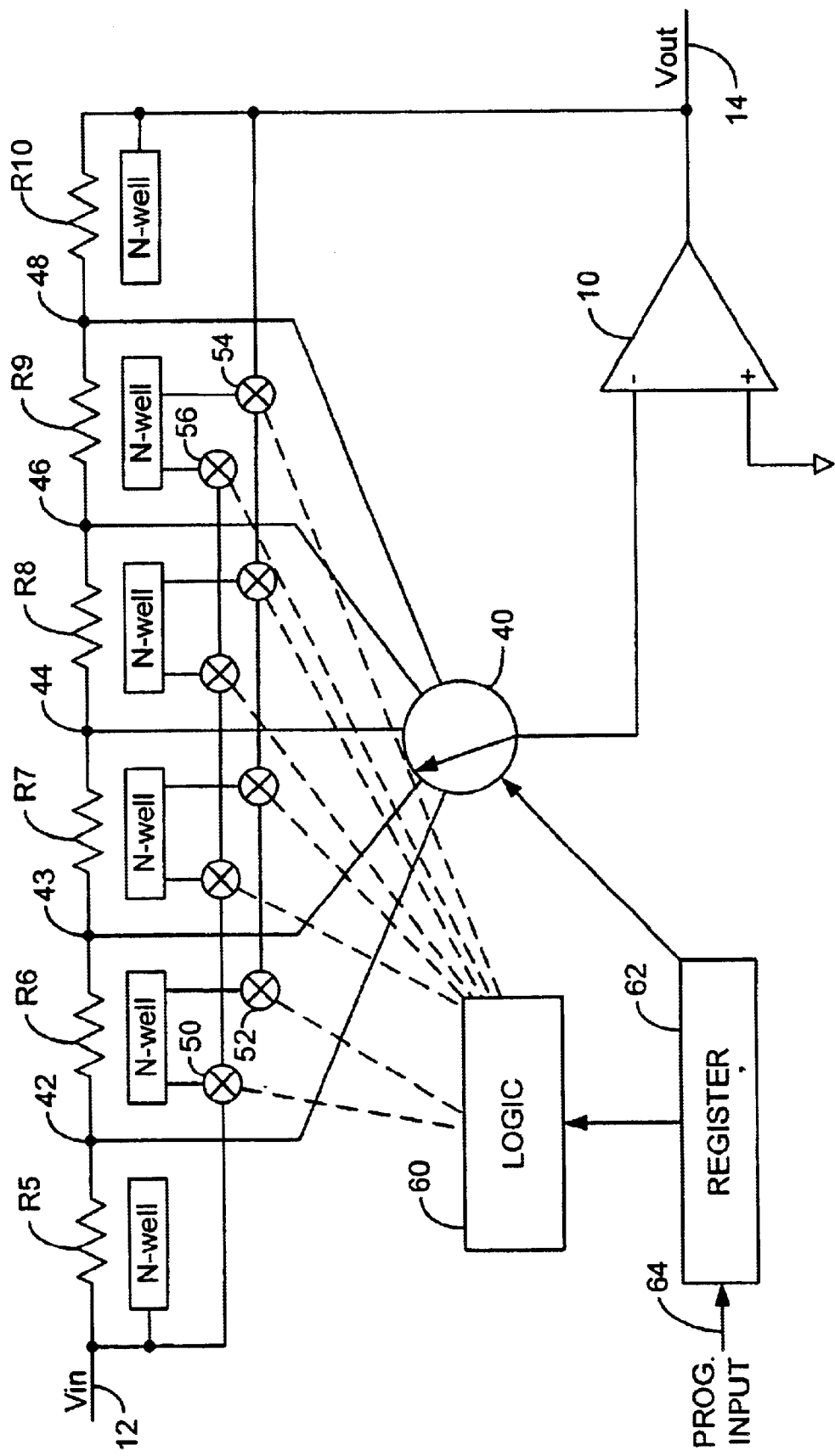
FIG. 5 is a circuit diagram illustrating the logic for providing the connections to an operational amplifier circuit according to the present invention.

FIG. 5 is a diagram illustrating the connection logic according to one embodiment of the present invention. This embodiment shows six resistors instead of the four resistors of prior diagrams. These resistors are R5–R10. Shown is a switching circuit 40 that can alternately connect to nodes 42 (between R5 and R6), 43, 44, 46 or 48. Shown beneath the resistors are the n-wells in which the resistors are formed. The n-wells for resistors R5 and R10 are shown already connected to the voltage input 12 and the voltage output 14, respectively. The remaining n-wells are connected to transistor switches such as switches 50, 52, 54 and 56 that can connect the n-well to either voltage input 12 or voltage output 14. These transistors are controlled by a logic circuit 60 that determines where the n-wells are connected. Logic circuit 60 responds to a digital value in a register 62 that is input through a programming input 64. Register 62 programs switch 40 to select the combination of resistors and thus program the gain of the operational amplifier circuit. Logic 60 observes this programming and accordingly programs the n-wells so that the n-wells associated with resistors in the input circuit are connected to the voltage input 12, while the n-wells associated with the feedback circuit are connected to the output 14. Logic circuit 60 could be eliminated in one embodiment, with register 62 directly connecting to the transistor switches or other types of switches connecting the n-wells to the voltage input or voltage output.

As will be understood by those of skill in the art, the present invention could be embodied in other specific forms without departing from the essential characteristics thereof. For example, eight resistors could be used instead of six, or any other number for the programmable circuit. Instead of an n-well, any other conductive or semi-conductive layer could be used as the plate of the capacitor. For example, a metal layer could be used for a metal resistor. Instead of polysilicon resistors, the resistors could be P+ material. The switches could be transmission gates or any other type of switching circuit. Accordingly, the foregoing description is intended to be illustrative, but not limiting, of the scope of the invention that is set forth in the following claims.

What is claimed is:

1. An operational amplifier circuit with compensation for parasitic capacitances associated with input circuit resistors and feedback circuit resistors, comprising:

a first semiconductor element between a first input circuit resistor and a substrate;

a second semiconductor element between a second, feedback circuit resistor and said substrate;

a first electrical connection connecting said first semiconductor element to a voltage input of said operational amplifier circuit; and a second electrical connection connecting said second semiconductor element to a voltage output of said operational amplifier circuit.

2. The circuit of claim 1 wherein said first and second semiconductor elements are n-wells.

3. The circuit of claim 2 wherein said resistors are polysilicon.

4. The circuit of claim 1 further comprising:

a plurality of additional resistors;

a plurality of separate semiconductor elements, each of said separate semiconductor elements being between one of said additional resistors and said substrate;

a first switching circuit for connecting each of said semiconductor elements to one of said voltage input and said voltage output.

5. The circuit of claim 4 further comprising:

a second switching circuit for programmably connecting each of said additional resistors into one of said input circuit and said feedback circuit;

whereby a first group of said semiconductor elements, which correspond to additional resistors connected into said feedback circuit, are connected to said voltage output; and whereby a second group of said semiconductor elements, which correspond to additional resistors connected into said input circuit, are connected to said voltage input.

6. The circuit of claim 5 further comprising:

a logic circuit, connected to said second switching circuit, and configured to detect a position of a switch connection in said second switching circuit and control said first switching circuit to provide a desired switch connection of said first switching circuit.

7. An operational amplifier circuit with compensation for parasitic capacitances associated with resistors of an input circuit and a feedback circuit, comprising:

a plurality of resistors;

a plurality of separate semiconductor elements, each of said separate semiconductor elements being between one of said resistors and said substrate;

a first switching circuit for connecting each of said semiconductor elements to one of a voltage input and a voltage output of said operational amplifier circuit;

a second switching circuit for programmably connecting each of said resistors into one of said input circuit and said feedback circuit;

whereby a first group of said semiconductor elements, which correspond to resistors connected into said feedback circuit, are connected to said voltage output; and a second group of said semiconductor elements, which correspond to additional resistors connected into said input circuit, are connected to said voltage input.

8. The circuit of claim 7 wherein said semiconductor elements are n-wells.

9. An operational amplifier circuit with compensation for parasitic capacitances associated with resistors of an input circuit and a feedback circuit, comprising:

a plurality of resistors;

a plurality of separate semiconductor elements, each of said separate semiconductor elements being between one of said resistors and said substrate;

a first switching circuit for connecting each of said semiconductor elements to one of a voltage input and a voltage output of said operational amplifier circuit;

a second switching circuit for programmably connecting each of said resistors into one of said input circuit and said feedback circuit;

whereby a first group of said semiconductor elements, which correspond to resistors connected into said feedback circuit, are connected to said voltage output;

a second group of said semiconductor elements, which correspond to additional resistors connected into said input circuit, are connected to said voltage input; and a logic circuit, connected to said second switching circuit, and configured to detect a position of a switch connection in said second switching circuit and control said first switching circuit to provide a desired switch connection of said first switching circuit.

10. A method for compensating for parasitic capacitances associated with input circuit resistors and feedback circuit resistors in an operational amplifier circuit, comprising:

providing a first semiconductor element between a first input circuit resistor and a substrate;

providing a second semiconductor element between a second, feedback circuit resistor and said substrate;

connecting said first semiconductor element to a voltage input of said operational amplifier circuit; and connecting said second semiconductor element to a voltage output of said operational amplifier circuit.

11. The method of claim 10 further comprising:

providing a plurality of additional resistors;

providing a plurality of separate semiconductor elements, each of said separate semiconductor elements being between one of said additional resistors and said substrate; and connecting each of said semiconductor elements to one of said voltage input and said voltage output.

12. The method of claim 11 further comprising:

programmably connecting each of said additional resistors into one of said input circuit and said feedback circuit;

whereby a first group of said semiconductor elements, which correspond to additional resistors connected into said feedback circuit, are connected to said voltage output; and whereby a second group of said semiconductor elements, which correspond to additional resistors connected into said input circuit, are connected to said voltage input.

13. The method of claim 10 wherein said semiconductor elements are n-wells.

* * * * *